(12) United States Patent
Curt et al.

(10) Patent No.: US 10,060,957 B2
(45) Date of Patent: Aug. 28, 2018

(54) METHOD AND APPARATUS FOR A CLOUD-BASED POWER QUALITY MONITOR

(71) Applicant: Power Monitors, Inc., Mt. Crawford, VA (US)

(72) Inventors: Walter M. Curt, Harrisonburg, VA (US); Christopher Mullins, Penn Laird, VA (US)

(73) Assignee: Power Monitors, Inc., Mt. Crawford, VA (US)

( * ) Notice: Subject to any disclaimer, the term of this patent is extended or adjusted under 35 U.S.C. 154(b) by 490 days.

(21) Appl. No.: 14/684,795

(22) Filed: Apr. 13, 2015

(65) Prior Publication Data

US 2015/0276825 A1 Oct. 1, 2015

Related U.S. Application Data

(63) Continuation-in-part of application No. 14/285,671, filed on May 23, 2014, now Pat. No. 9,519,559.
(Continued)

(51) Int. Cl.
*G01R 19/25* (2006.01)
*G06F 11/30* (2006.01)
(Continued)

(52) U.S. Cl.
CPC ......... *G01R 19/2513* (2013.01); *G01D 9/005* (2013.01); *G01D 21/00* (2013.01); *G06F 11/3058* (2013.01)

(58) Field of Classification Search
CPC .... G01R 19/2513; G01D 21/00; G01D 9/005; G06F 11/3058
See application file for complete search history.

(56) References Cited

U.S. PATENT DOCUMENTS 2,855,916 A 10/1958 Foster
3,516,063 A 6/1970 Arkin et al.
(Continued)

FOREIGN PATENT DOCUMENTS

CN 2765183 Y 3/2006
DE 102007026290 A1 7/2008
(Continued)

OTHER PUBLICATIONS

Chinese Office Action dated Jul. 6, 2010. Chinese Patent Application No. 200780015356.0 (8 pages).
(Continued)

*Primary Examiner* — Charles Kasenge
(74) *Attorney, Agent, or Firm* — Baker & Hostetler LLP

(57) ABSTRACT

A system includes a plurality of power quality devices for continuously measuring and buffering power quality data and transmitting the buffered power quality data on a periodic basis and one or more cloud-based servers communicatively coupled to the plurality of power quality devices. The one or more cloud-based servers are operable to: receive the buffered data transmitted by the power quality devices; decompress and store the buffered data in a database; and display on a web page one or more of a stripchart, daily profile, histogram, waveform, vector diagram, harmonic bar chart, and 3D harmonic graph generated using the stored data. The system also includes one or more computing devices communicatively coupled to the plurality of power quality devices and the one or more cloud-based servers.

17 Claims, 6 Drawing Sheets

Related U.S. Application Data which is a continuation of application No. 13/193,910, filed on Jul. 29, 2011, now Pat. No. 8,775,109.

(60) Provisional application No. 61/979,201, filed on Apr. 14, 2014, provisional application No. 61/369,045, filed on Jul. 29, 2010.

(51) Int. Cl.
*G01D 9/00* (2006.01)
*G01D 21/00* (2006.01)

(56) References Cited

U.S. PATENT DOCUMENTS

| | | | |
|---|---|---|---|
| 4,067,054 A | 1/1978 | Clark | |
| 4,540,182 A | 9/1985 | Clement | |
| 4,558,275 A | 12/1985 | Borowy et al. | |
| 4,731,574 A | 3/1988 | Melbert | |
| 4,731,575 A | 3/1988 | Sloan | |
| 4,800,492 A | 1/1989 | Johnson et al. | |
| 5,029,282 A | 7/1991 | Ito | |
| 5,083,638 A | 1/1992 | Schneider | |
| 5,107,202 A | 4/1992 | Renda | |
| 5,181,026 A | 1/1993 | Granville | |
| 5,241,283 A | 8/1993 | Sutterlin | |
| 5,410,735 A | 4/1995 | Borchardt et al. | |
| 5,420,799 A | 5/1995 | Peterson et al. | |
| 5,488,202 A | 1/1996 | Baitz et al. | |
| 5,491,463 A | 2/1996 | Sargeant et al. | |
| 5,565,783 A | 10/1996 | Lau et al. | |
| 5,583,801 A | 12/1996 | Croyle et al. | |
| 5,602,794 A | 2/1997 | Javanifard et al. | |
| 5,617,286 A | 4/1997 | Jenkins | |
| 5,641,898 A | 6/1997 | Chang | |
| 5,659,453 A | 8/1997 | Russell et al. | |
| 5,725,062 A | 3/1998 | Fronek | |
| 5,726,646 A | 3/1998 | Bane et al. | |
| 5,732,039 A | 3/1998 | Javanifard et al. | |
| 5,752,046 A | 5/1998 | Oprescu et al. | |
| 5,767,735 A | 6/1998 | Javanifard et al. | |
| 5,781,473 A | 7/1998 | Javanifard et al. | |
| 5,796,631 A | 8/1998 | Iancu et al. | |
| 5,831,538 A | 11/1998 | Schena | |
| 5,892,430 A | 4/1999 | Wiesman et al. | |
| 5,898,158 A | 4/1999 | Shimizu et al. | |
| 5,905,616 A | 5/1999 | Lyke | |
| 5,917,428 A | 6/1999 | Discenzo et al. | |
| 5,937,386 A | 8/1999 | Frantz | |
| 5,939,974 A | 8/1999 | Heagle et al. | |
| 5,943,202 A * | 8/1999 | Beckwith | H02J 13/0075 361/115 |
| 5,943,226 A | 8/1999 | Kim | |
| 6,005,758 A | 12/1999 | Spencer et al. | |
| 6,005,759 A | 12/1999 | Hart et al. | |
| 6,022,315 A | 2/2000 | Iliff | |
| 6,034,859 A | 3/2000 | Baumgartl | |
| 6,049,880 A | 4/2000 | Song | |
| 6,091,337 A | 7/2000 | Arshad et al. | |
| 6,107,862 A | 8/2000 | Mukainakano et al. | |
| 6,115,695 A | 9/2000 | Kern | |
| 6,151,229 A | 11/2000 | Taub et al. | |
| 6,169,406 B1 | 1/2001 | Peschel | |
| 6,169,444 B1 | 1/2001 | Thurber, Jr. | |
| 6,212,049 B1 | 4/2001 | Spencer et al. | |
| 6,222,443 B1 | 4/2001 | Beeson et al. | |
| 6,307,425 B1 | 10/2001 | Chevallier et al. | |
| 6,313,394 B1 | 11/2001 | Shugar et al. | |
| 6,317,031 B1 | 11/2001 | Rickard | |
| 6,356,426 B1 | 3/2002 | Dougherty | |
| 6,360,177 B1 | 3/2002 | Curt et al. | |
| 6,369,642 B1 | 4/2002 | Zeng | |
| 6,384,348 B1 | 5/2002 | Haga et al. | |
| 6,415,244 B1 | 7/2002 | Dickens et al. | |
| 6,437,692 B1 | 8/2002 | Petite et al. | |
| 6,516,279 B1 | 2/2003 | Jansen et al. | |
| 6,545,482 B1 | 4/2003 | Fedirchuk et al. | |
| 6,545,529 B2 | 4/2003 | Kim | |
| 6,603,218 B1 | 8/2003 | Aisa | |
| 6,628,496 B2 | 9/2003 | Montjean | |
| 6,633,163 B2 | 10/2003 | Fling | |
| 6,633,823 B2 | 10/2003 | Bartone et al. | |
| 6,647,024 B1 | 11/2003 | Dombkowski et al. | |
| 6,653,945 B2 | 11/2003 | Johnson et al. | |
| 6,687,680 B1 | 2/2004 | Iguchi et al. | |
| 6,690,594 B2 | 2/2004 | Amarillas et al. | |
| 6,704,568 B2 | 3/2004 | Montjean | |
| 6,734,682 B2 | 5/2004 | Tallman et al. | |
| 6,789,206 B1 | 9/2004 | Wierzbicki et al. | |
| 6,792,337 B2 | 9/2004 | Blackett et al. | |
| 6,836,099 B1 | 12/2004 | Amarillas et al. | |
| 6,839,597 B2 | 1/2005 | Hattori et al. | |
| 6,842,719 B1 | 1/2005 | Fitzpatrick et al. | |
| 6,866,193 B1 | 3/2005 | Shimizu et al. | |
| 6,912,678 B1 | 6/2005 | Floro et al. | |
| 6,928,564 B2 | 8/2005 | Tada et al. | |
| 6,931,445 B2 | 8/2005 | Davis | |
| 6,944,058 B2 | 9/2005 | Wong | |
| 6,957,158 B1 | 10/2005 | Hancock et al. | |
| 6,961,641 B1 | 11/2005 | Forth et al. | |
| 6,993,417 B2 | 1/2006 | Osann, Jr. | |
| 6,995,603 B2 | 2/2006 | Chen et al. | |
| 7,004,784 B2 | 2/2006 | Castle | |
| 7,009,379 B2 | 3/2006 | Ramirez | |
| 7,130,722 B2 | 10/2006 | Soni | |
| 7,135,850 B2 | 11/2006 | Ramirez | |
| 7,177,824 B2 | 2/2007 | Sabongi et al. | |
| 7,209,804 B2 | 4/2007 | Curt et al. | |
| 7,233,843 B2 * | 6/2007 | Budhraja | H02J 3/008 700/291 |
| 7,242,109 B2 | 7/2007 | Beeren | |
| 7,348,769 B2 | 3/2008 | Ramirez | |
| 7,412,338 B2 | 8/2008 | Wynans et al. | |
| 7,460,467 B1 | 12/2008 | Corcoran | |
| 7,462,952 B2 | 12/2008 | Bailey | |
| 7,489,138 B2 | 2/2009 | Yu et al. | |
| 7,669,061 B2 | 2/2010 | Curt et al. | |
| 7,769,149 B2 | 8/2010 | Berkman | |
| 7,795,877 B2 | 9/2010 | Radtke et al. | |
| 7,804,280 B2 | 9/2010 | Deaver, Sr. et al. | |
| 7,818,159 B2 | 10/2010 | Kim et al. | |
| 7,873,441 B2 | 1/2011 | Synesiou et al. | |
| 7,956,673 B2 | 6/2011 | Pan | |
| 8,060,259 B2 * | 11/2011 | Budhraja | H02J 3/008 700/291 |
| 8,121,801 B2 | 2/2012 | Spanier et al. | |
| 8,125,345 B2 | 2/2012 | Curt et al. | |
| 8,160,824 B2 | 4/2012 | Spanier et al. | |
| 8,305,737 B2 | 11/2012 | Ewing et al. | |
| 8,362,789 B2 | 1/2013 | Collins et al. | |
| 8,494,661 B2 | 7/2013 | Ewing et al. | |
| 8,775,109 B2 | 7/2014 | Curt et al. | |
| 9,280,796 B2 * | 3/2016 | Synesiou | G06Q 10/00 |
| 2002/0008566 A1 | 1/2002 | Taito et al. | |
| 2002/0043969 A1 | 4/2002 | Duncan et al. | |
| 2002/0063635 A1 | 5/2002 | Shincovich | |
| 2002/0082924 A1 | 6/2002 | Koether | |
| 2002/0112250 A1 | 8/2002 | Koplar et al. | |
| 2002/0130701 A1 | 9/2002 | Kleveland | |
| 2002/0143482 A1 | 10/2002 | Karanam et al. | |
| 2002/0182570 A1 | 12/2002 | Croteau et al. | |
| 2003/0046377 A1 | 3/2003 | Daum et al. | |
| 2003/0069796 A1 | 4/2003 | Elwood et al. | |
| 2003/0126735 A1 | 7/2003 | Taniguchi et al. | |
| 2003/0158677 A1 | 8/2003 | Swartzrauber et al. | |
| 2003/0167178 A1 | 9/2003 | Jarman et al. | |
| 2003/0197989 A1 | 10/2003 | Nojima | |
| 2003/0224784 A1 | 12/2003 | Hunt et al. | |
| 2003/0225713 A1 | 12/2003 | Atkinson et al. | |
| 2004/0008023 A1 | 1/2004 | Jang et al. | |
| 2004/0024913 A1 | 2/2004 | Ikeda et al. | |
| 2004/0124247 A1 | 7/2004 | Watters | |
| 2004/0128085 A1 | 7/2004 | Ramirez | |
| 2004/0138786 A1 | 7/2004 | Blackett et al. | |

(56) References Cited

U.S. PATENT DOCUMENTS

| | | |
|---|---|---|
| 2004/0138835 A1 | 7/2004 | Ransom et al. |
| 2004/0210621 A1 | 10/2004 | Antonellis |
| 2004/0242087 A1 | 12/2004 | Hoshina |
| 2005/0049921 A1 | 3/2005 | Tengler et al. |
| 2005/0052186 A1 | 3/2005 | Grube |
| 2005/0065743 A1 | 3/2005 | Cumming et al. |
| 2005/0138432 A1 | 6/2005 | Ransom et al. |
| 2005/0144099 A1 | 6/2005 | Deb et al. |
| 2005/0154490 A1 | 7/2005 | Blaine et al. |
| 2005/0154499 A1 | 7/2005 | Aldridge et al. |
| 2005/0212526 A1 | 9/2005 | Blades |
| 2005/0216349 A1 | 9/2005 | Vaseloff et al. |
| 2005/0256774 A1 | 11/2005 | Clothier et al. |
| 2005/0273183 A1 | 12/2005 | Curt et al. |
| 2005/0273281 A1* | 12/2005 | Wall ................. G01D 4/004 702/60 |
| 2006/0047543 A1 | 3/2006 | Moses |
| 2006/0061480 A1 | 3/2006 | Bowman |
| 2006/0062400 A1 | 3/2006 | Chia-chun |
| 2006/0071776 A1 | 4/2006 | White, II et al. |
| 2006/0087322 A1 | 4/2006 | Mccollough, Jr. |
| 2006/0087783 A1 | 4/2006 | Holley |
| 2006/0098371 A1 | 5/2006 | Wambsganss et al. |
| 2006/0111040 A1 | 5/2006 | Jenkins et al. |
| 2006/0114121 A1 | 6/2006 | Cumeralto et al. |
| 2006/0145685 A1 | 7/2006 | Ramirez |
| 2006/0158177 A1 | 7/2006 | Ramirez |
| 2006/0176630 A1 | 8/2006 | Carlino et al. |
| 2006/0181838 A1 | 8/2006 | Ely |
| 2006/0190140 A1 | 8/2006 | Soni |
| 2006/0190209 A1 | 8/2006 | Odom |
| 2006/0218057 A1 | 9/2006 | Fitzpatrick et al. |
| 2006/0244518 A1 | 11/2006 | Byeon et al. |
| 2006/0271244 A1 | 11/2006 | Cumming et al. |
| 2006/0271314 A1 | 11/2006 | Hayes |
| 2007/0007968 A1 | 1/2007 | Mauney, Jr. et al. |
| 2007/0010916 A1 | 1/2007 | Rodgers |
| 2007/0053216 A1 | 3/2007 | Alenin |
| 2007/0055889 A1* | 3/2007 | Henneberry ....... G01R 19/2513 713/186 |
| 2007/0064622 A1 | 3/2007 | Bi et al. |
| 2007/0080819 A1 | 4/2007 | Marks et al. |
| 2007/0126569 A1 | 6/2007 | Dagci |
| 2007/0129087 A1 | 6/2007 | Bell |
| 2007/0211768 A1 | 9/2007 | Cornwall et al. |
| 2007/0230377 A1 | 10/2007 | Nosaka et al. |
| 2007/0286089 A1 | 12/2007 | Nasle et al. |
| 2007/0290845 A1 | 12/2007 | Benjelloun et al. |
| 2008/0024096 A1 | 1/2008 | Pan |
| 2008/0030317 A1 | 2/2008 | Bryant |
| 2008/0036472 A1 | 2/2008 | Collins, Jr. et al. |
| 2008/0042731 A1 | 2/2008 | Daga et al. |
| 2008/0106425 A1 | 5/2008 | Deaver et al. |
| 2008/0129307 A1 | 6/2008 | Yu et al. |
| 2008/0157730 A1 | 7/2008 | Kim et al. |
| 2008/0159244 A1 | 7/2008 | Hunziker |
| 2008/0172312 A1* | 7/2008 | Synesiou ............ G06Q 10/00 705/34 |
| 2008/0224617 A1 | 9/2008 | Keller et al. |
| 2008/0235355 A1 | 9/2008 | Spanier et al. |
| 2008/0249723 A1 | 10/2008 | Mcallister et al. |
| 2008/0312851 A1 | 12/2008 | Kagan et al. |
| 2009/0027061 A1 | 1/2009 | Curt et al. |
| 2009/0102680 A1 | 4/2009 | Roos |
| 2009/0115426 A1 | 5/2009 | Muench, Jr. |
| 2009/0146839 A1 | 6/2009 | Reddy et al. |
| 2009/0167308 A1 | 7/2009 | Lomes |
| 2009/0167418 A1 | 7/2009 | Raghavan |
| 2009/0187285 A1 | 7/2009 | Yaney et al. |
| 2009/0198383 A1* | 8/2009 | Gardner ................. H02J 3/08 700/286 |
| 2009/0234512 A1* | 9/2009 | Ewing ............... H04L 12/10 700/295 |
| 2009/0248214 A1* | 10/2009 | Fickey ............. G06Q 10/06 700/286 |
| 2009/0281679 A1 | 11/2009 | Taft et al. |
| 2009/0289637 A1* | 11/2009 | Radtke ............. G01R 27/16 324/629 |
| 2009/0296488 A1 | 12/2009 | Nguyen et al. |
| 2010/0033136 A1 | 2/2010 | Yang |
| 2010/0046545 A1* | 2/2010 | Kagan ............. H04L 12/4633 370/466 |
| 2010/0070217 A1 | 3/2010 | Shimada et al. |
| 2010/0074034 A1 | 3/2010 | Cazzaniga |
| 2010/0100250 A1* | 4/2010 | Budhraja ............ H02J 3/008 700/291 |
| 2010/0138066 A1* | 6/2010 | Kong ................ G06Q 30/018 700/295 |
| 2010/0179776 A1* | 7/2010 | Van Gorp ......... G01R 19/2513 702/61 |
| 2010/0244935 A1 | 9/2010 | Kim et al. |
| 2010/0295692 A1 | 11/2010 | Bjørn |
| 2010/0324845 A1 | 12/2010 | Spanier et al. |
| 2010/0328849 A1 | 12/2010 | Ewing et al. |
| 2011/0173109 A1* | 7/2011 | Synesiou ............ G06Q 10/00 705/34 |
| 2012/0077527 A1 | 3/2012 | Santiago et al. |
| 2012/0139335 A1 | 6/2012 | Holland |
| 2012/0154023 A1 | 6/2012 | Pan et al. |
| 2012/0181095 A1 | 7/2012 | Lopez |
| 2012/0200284 A1 | 8/2012 | Dionne |
| 2013/0073232 A1 | 3/2013 | Billingsley et al. |

FOREIGN PATENT DOCUMENTS

| | | |
|---|---|---|
| EP | 0382929 | 12/1989 |
| EP | 780515 A1 | 6/1997 |
| EP | 2256505 A2 | 12/2010 |
| EP | 2413105 A2 | 2/2012 |
| FR | 2797356 A1 | 2/2001 |
| JP | S64-041540 A | 2/1989 |
| JP | 2154157 A | 6/1990 |
| JP | 6074783 A | 3/1994 |
| JP | H07-032000 A | 2/1995 |
| JP | 08101246 A | 4/1996 |
| JP | 09107318 A | 4/1997 |
| JP | 10271651 A | 10/1998 |
| JP | 2000171492 A | 6/2000 |
| JP | 2003069731 A | 3/2003 |
| JP | 2004088771 A | 3/2004 |
| JP | 2004320228 A | 11/2004 |
| JP | 2005190481 A | 7/2005 |
| JP | 2006344144 A | 12/2006 |
| JP | 2007020268 A | 1/2007 |
| JP | 2002199625 A | 7/2007 |
| JP | 2007214784 A | 8/2007 |
| WO | 2012130509 | 12/1989 |
| WO | 0106336 A | 1/2001 |
| WO | 2006132757 A2 | 12/2006 |
| WO | 2007116835 A1 | 10/2007 |

OTHER PUBLICATIONS

European Examination Report dated Feb. 5, 2011 for European Application No. 07 758 717.8-2006 (4 pages).
Chinese Office Action dated Sep. 28, 2011 for Chinese Patent Appln. No. 200880005285.0 (16 pages).
Chinese Office Action dated Nov. 14, 2012 for Chinese Patent Appln. No. 200880005285.0 (8 pages).
International Search Report and Written Opinion dated Jul. 8, 2008 for International Patent Appln. No. PCT/US08/50583 (11 pages).
International Search Report and Written Opinion dated Jul. 7, 2008 for International Patent Appln. No. PCT/US04/32880 (9 pages).
International Search Report and Written Opinion dated Feb. 11, 2008 for International Patent Appln. No. PCT/US07/64196 (9 pages).
International Search Report and Written Opinion dated Mar. 3, 2008 for International Patent Appln. No. PCT/US07/77418 (9 pages).
International Search Report and Written Opinion dated Jul. 23, 2008 for International Patent Appln. No. PCT/US08/55613 (7 pages).

(56) References Cited

OTHER PUBLICATIONS

International Search Report and Written Opinion dated Jul. 31, 2008 for International Patent Appln. No. PCT/US08/56008 (10 pages).
International Search Report and Written Opinion dated Sep. 26, 2008 for International Patent Appln. No. PCT/US08/70879 (8 pages).
International Search Report and Written Opinion dated Oct. 3, 2008 for International Patent Appln. No. PCT/US08/70881 (8 pages).
International Search Report and Written Opinion dated May 8, 2009 for International Patent Appln. No. PCT/US09/35693 (5 pages).
Japanese Office Action dated Sep. 4, 2012 for Japanese Patent Appln. No. P2009-545014 (8 pages).
Japanese Office Action dated Feb. 14, 2012 for Japanese Patent Appln. No. P2009-500631 (6 pages).
International Search Report and Written Opinion dated Jun. 3, 2008 for International Patent Appln. No. PCT/US04/26874 (5 pages).
International Search Report and Written Opinion dated Nov. 2, 2005 for International Patent Appln. No. PCT/US04/32878 (5 pages).
International Search Report and Written Opinion dated Jul. 9, 2015 for International Patent Appln. No. PCT/US2015/025710. (11 pages).
International Patent Application No. PCT/US2015/025710; Int'l Preliminary Report on Patentability; dated Oct. 21, 2016; 8 pages.
Search Report issued in European Application No. 17172589.8, dated Apr. 19, 2018.

* cited by examiner

METHOD AND APPARATUS FOR A CLOUD-BASED POWER QUALITY MONITOR

CROSS-REFERENCE TO RELATED APPLICATIONS

This application claims the benefit of U.S. patent application Ser. No. 61/979,201, filed on Apr. 14, 2014, and is a continuation-in-part of U.S. patent application Ser. No. 14/285,671, filed on May 23, 2014, which is a continuation of U.S. patent application Ser. No. 13/193,910, filed Jul. 29, 2011, now U.S. Pat. No. 8,775,109, which claims the benefit of U.S. Patent Application Ser. No. 61/369,045, filed on Jul. 29, 2010, each of which is hereby incorporated by reference in its entirety.

TECHNICAL FIELD

The present specification generally relates to systems and methods for measurement of power quality and, more specifically, cloud-based systems and methods for measuring and monitoring power quality.

BACKGROUND

Traditional power quality (PQ) monitors require the user to travel to the device to download recorded data before any analysis can be performed. More advanced devices allow for remote connections directly to the monitor, but this still requires an explicit data download period, and the presence of a good communication link at the time of the download (which can be lengthy for a long recording). The traditional data logger paradigm doesn't allow for real-time or near-real-time notifications, and makes timely data analysis difficult.

Additionally, modern IT requirements present formidable barriers to traditional PQ analysis. Due to security requirements at many US electric utilities, upgrading software packages and sharing PQ data files is a slow and cumbersome process. Data retention policies can prevent long term storage of collected data, and sending large data sets from one user to another is difficult with the increased file sizes from modern recorders.

Accordingly, a need exists for alternative systems and methods for measurement and monitoring of power quality.

SUMMARY

In one embodiment, a system includes plurality of power quality devices and one or more cloud-based servers communicatively coupled to the plurality of power quality devices. The plurality of power quality devices continuously measure and buffer data including at least one of RMS voltage, RMS current, real, reactive and apparent power, power factor, displacement power factor, phase angle, harmonic magnitudes and phases, interharmonics, IFL, Pst, and Plt flicker, symmetrical components, phasors, aggregating triggered waveforms, and transients, and periodically transmit the buffered data. The one or more cloud-based servers are operable to receive the buffered data transmitted by the plurality of power quality devices; decompress and store the buffered data in a database; display on a web page one or more of a stripchart, daily profile, histogram, waveform, vector diagram, harmonic bar chart, and 3D harmonic graph generated using the stored data; and correlate an event alert received from a first of the plurality of power quality devices with data received from a second of the plurality of power quality devices.

In another embodiment, a computer-implemented method includes receiving, from a first power quality device, at least one of an RMS voltage, an RMS current, a power factor, a displacement power factor, a phase angle, harmonic magnitudes and phases, interharmonics, IFL, Pst, and Plt flicker, symmetrical components, phasors, aggregated triggered waveforms, and transients approximately every five minutes. The method also includes displaying a map on a web page, wherein the map comprises a marker indicating a location of the first power quality device and a second power quality device. Next, the method includes displaying on the web page at least one chart or graph showing one or more of the RMS voltage, the RMS current, the power factor, the displacement power factor, the phase angle, the harmonic magnitudes and phases, the interharmonics, the IFL, the Pst, and Plt flicker, the symmetrical components, the phasors, the aggregated triggered waveforms, and the transients. The method further includes receiving, from the first power quality device, a triggered condition alert and identifying at least one related event based on data received from the second power quality device.

In yet another embodiment, a system includes a plurality of power quality devices for continuously measuring and buffering power quality data and transmitting the buffered power quality data on a periodic basis and one or more cloud-based servers communicatively coupled to the plurality of power quality devices. The one or more cloud-based servers are operable to: receive the buffered data transmitted by the power quality devices; decompress and store the buffered data in a database; and display on a web page one or more of a stripchart, daily profile, histogram, waveform, vector diagram, harmonic bar chart, and 3D harmonic graph generated using the stored data. The system also includes one or more computing devices communicatively coupled to the plurality of power quality devices and the one or more cloud-based servers. The one or more computing devices are operable to receive a user input to the web page.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments describe a system including at least one power quality ("PQ") device communicatively coupled to one or more cloud-based servers. The system may enable a user to use a standard web browser to analyze data that the PQ device has fed into the system as it was collected, so data is always up to date from all devices, with no explicit download required.

Various embodiments of a cloud-based power quality monitoring system are described here. Generally, the system is composed of two parts—one or more physical PQ devices, and the cloud-based PQ software. The PQ devices are installed in the electrical distribution system, often at the point of common coupling with an electric power customer, a monitoring point in the utility's infrastructure, or at the electrical connection to sensitive or high-value equipment (e.g., large electronically controlled motor).

Figure 1:
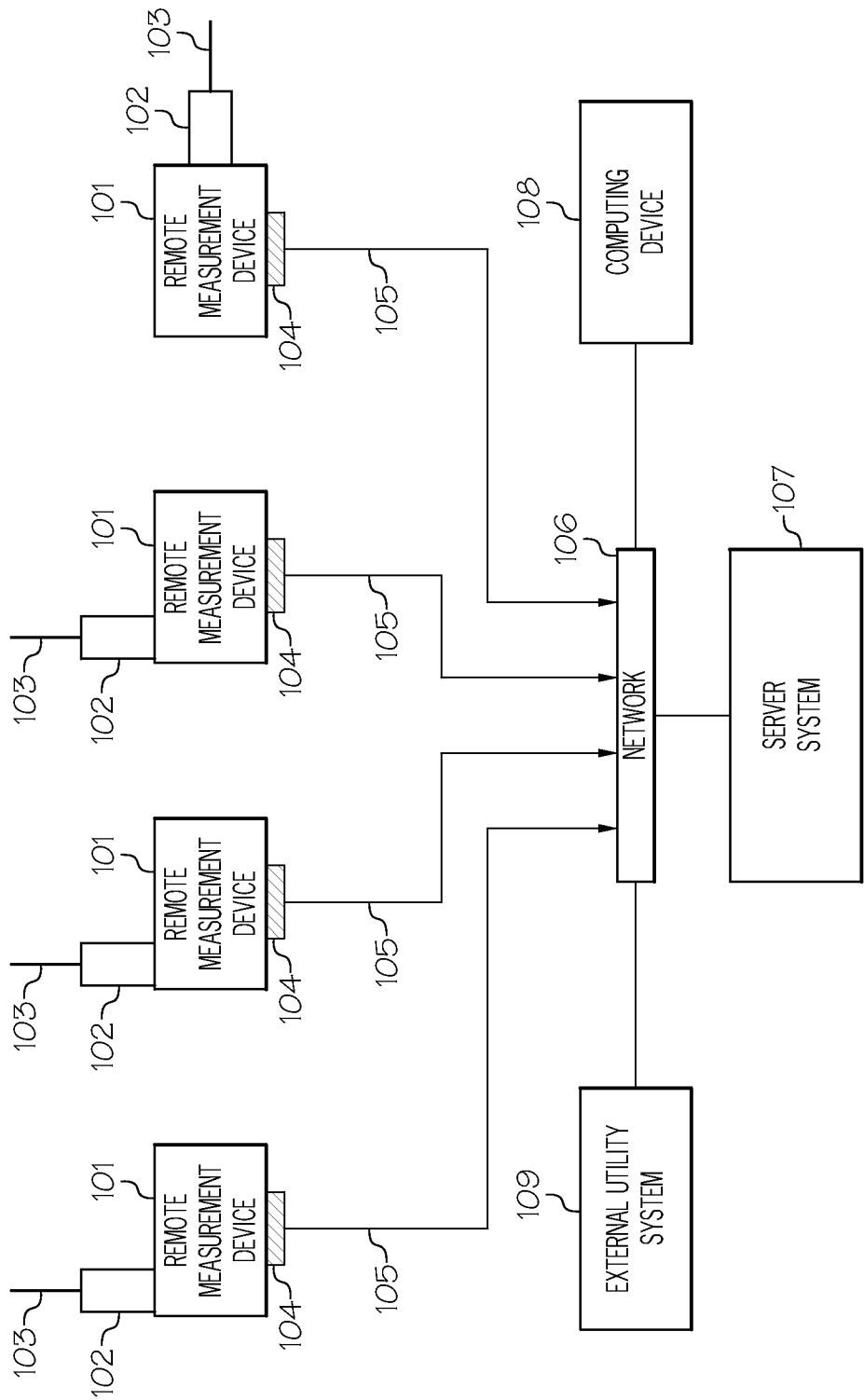
FIG. 1 schematically depicts a system for monitoring a power distribution system including multiple remote power quality monitors according to one or more embodiments shown and described herein.

As shown in FIG. 1, the system may include one or more power quality (PQ) monitors 101 and a cloud-based server system 107. The PQ devices 101 may be installed in a power distribution system, and may receive voltage from a powerline 103 through a voltage input 102. The PQ device 101 may use a wireless communications device 104 to communicate, using wireless signals 105 (represented as lines for the purposes of illustration only) with the cloud-based server system 107, through a network 106. The network 106 may be, for example, the Internet. A computing device 108 and an external utility system 109 may access the cloud-based server system 107, for example, through the network 106.

FIG. 1 includes multiple PQ devices 101, which may be installed at strategic locations in a power distribution system. The cloud-based server system 107 may receive data from, and send data to, any of the PQ devices 101. Data received from the PQ devices 101, such as, for example, voltage readings, including RMS voltage, may be stored by the cloud-based server system 107, for example in a database.

The PQ device 101 is a device that can operate as a standalone monitor, or in conjunction with the cloud-based server system 107, and in particular the software hosted by the cloud-based server system 107. The PQ device 101 may be, for example, a device such as the Boomerang®, the Revolution®, or the Guardian® available from Power Monitors, Inc. (Mt. Crawford, Va.). In various embodiments, the PQ device 101 may be a device including the features and functions such as those described in greater detail in commonly owned U.S. Pat. Nos. 7,881,907, 7,209,804, and 8,775,109, each of which is hereby incorporated by reference in its entirety.

Figure 2:
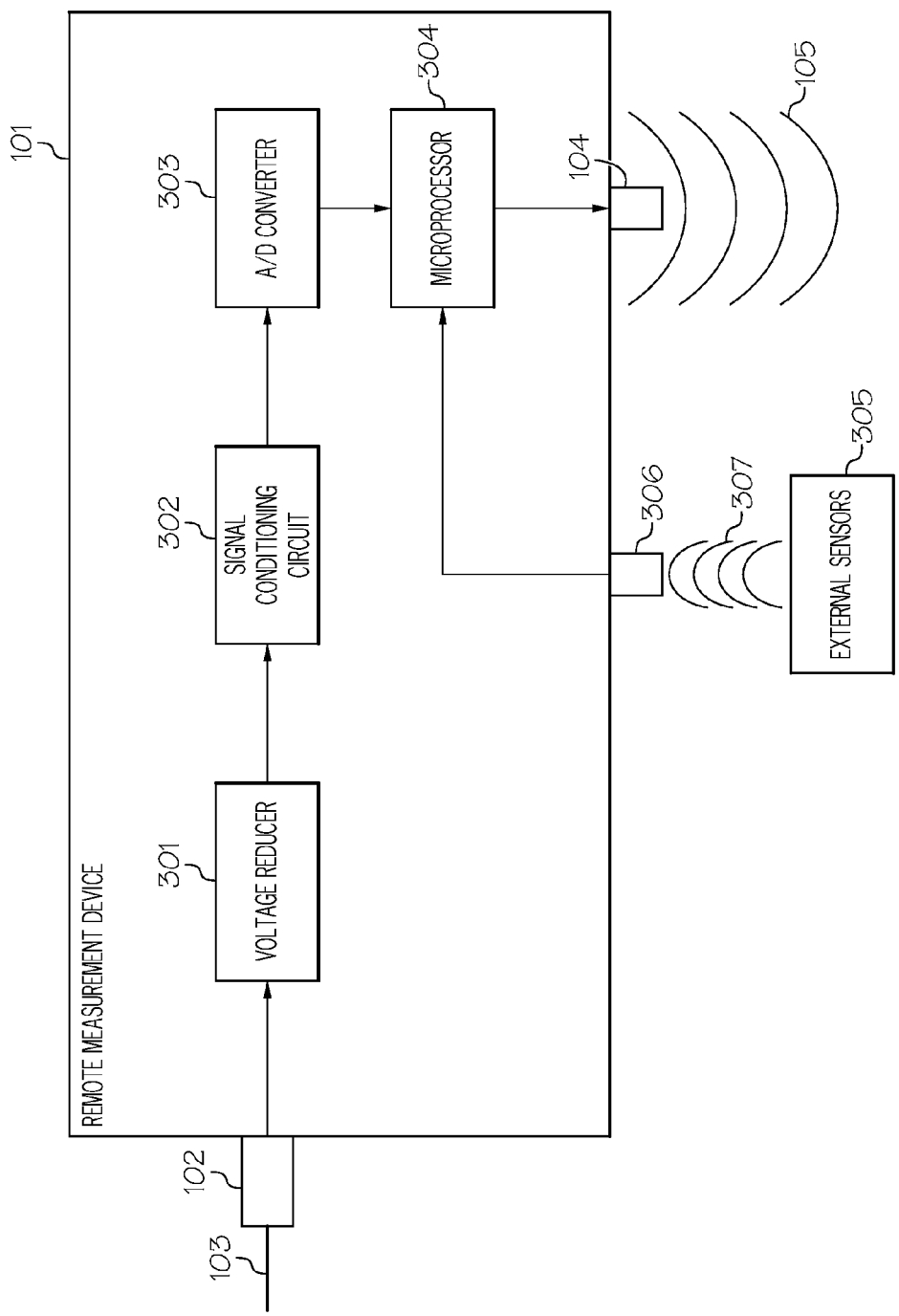
FIG. 2 schematically depicts a power quality monitor according to one or more embodiments shown and described herein.

FIG. 2 schematically depicts a PQ device 101 in greater detail. As shown in FIG. 2, the PQ device 101 includes the voltage input 102 for the powerline 103. The PQ device 101 may also include a voltage reducer 301, a signal conditioning circuit 302, an analog to digital (A/D) convertor 303, a microprocessor 304, the wireless communications device 104, and a low power wireless communications device 306. In various embodiments, the PQ device 101 includes circuitry and external leads. The external leads connect to the voltage to be recorded, and the transducers clamp around the conductor of the voltage or use other means to convert the current flow into a suitable input signal. The circuitry may be contained within a unitary casing, or an external clamp portion may be utilized to incorporate signal conditioning circuitry. In some embodiments, a current transducer may also be included.

The voltage reducer 301 may be any suitable device for reducing the voltage received by the voltage input 102 from the powerline 103. For example, the voltage reducer 301 may be a resistive divider circuit. The signal conditioning circuit 302 may be any suitable device for conditioning the reduced voltage signal from the voltage reducer 301. For example, the voltage reducer 301 may be a low-pass filter.

The A/D convertor 303 may be any suitable device for digitizing an analog signal. The A/D convertor 303 may receive the voltage signal and convert the voltage signal into a digital signal including digital samples, using any suitable sample rate. The digital signal from the A/D convertor 303 may be sent to the microprocessor 304.

In various embodiments, sampling rates can include approximately 256 samples per line cycle (e.g., 1/(256×60 Hz)=65 microsecond sample length), or 1 MHz or higher for high-speed transient capture. The raw waveform samples may be fed into the microprocessor 304 (i.e., a digital signal processor or DSP) so that RMS voltage, RMS current, real, reactive and apparent power, power factor, displacement power factor, phase angle, harmonic magnitudes and phases, interharmonics, IFL, Pst, and Plt flicker, symmetrical components, phasors (as per the Phasor Measurement Unit specification) and other PQ metrics may be computed on a cycle-by-cycle basis (or other time period, as appropriate).

The sampling may be synchronized to the line frequency through software PLL algorithms. In various embodiments, these measurements are aggregated into 1 second averages, maximums, and minimums. In some embodiments, programmable triggers may cause the cycle readings or raw waveform data to be stored as a waveform or transient capture record.

In various embodiments, the 1 second min/ave/max readings are further processed by the PQ device 101 to form longer term averages, daily profiles, histograms, GE flicker records, significant change records, etc. This data may be stored locally in the PQ device 101, and may also be aggregated and sent to the cloud-based server system. The aggregation sizes for triggered waveforms, transients, and other triggered PQ events may vary and, in some embodiments, are user adjustable, to allow trade-offs in compression efficiency and faster updates to the cloud-based server system.

In various embodiments, the 1 second min/ave/max readings for each PQ metric are further collected into a buffer sized to minimize network overhead when transmitting to the cloud system. A typical buffer length may be 1 minute, 5 minutes, or another suitable length. The data is then re-arranged to facilitate compression, and then fed to a compression algorithm. The compressed data wrapped with a header that identifies the monitor, and also the recording session, so that the cloud software can reconstruct a recording session from the continuous stream of data. The data is time-stamped from the device's internal real time clock (RTC). The RTC is synchronized through NTP or SNTP if a reliable time server is available via network connection, and/or GPS if present in the cell modem hardware or as a separate subsystem in the PQ device. The RTC internal oscillator may be disciplined to the GPS clock so that in periods of no external reference, the RTC clock is as accurate as possible. In some embodiments, this packet may be sent through the wireless communications device 104 or low-power wireless communications device 306, although other communications channels may be used depending on the particular embodiment. The communications channels may include, but are not limited to, Bluetooth, WiFi, cellular (CDMA, TDMA, GSM, LTE, etc.), optical, satellite, RF, conventional telephone system, Ethernet (wired or wireless), LAN, WAN, or the like.

In various embodiments, the PQ device 101 continuously measures and buffers PQ information, and checks for any triggering conditions. In some embodiments, the PQ device 101 contains all analog and digital circuitry necessary to digitize voltage and current waveform data collected from the conductor, transducer, and external leads. From such data, power quality parameters such as RMS voltage and current, real power, apparent power, phase angle, reactive power, power factors, harmonics (including magnitudes and phases), displaced power factor, total harmonic distortion, total power quantities, total real power, total reactive power, total apparent power, total power factors, phase angles, cycle histograms, cycle event changes, flicker, abnormal voltages, tansients, and power outages, and the like can be computed by the PQ device 101. In some embodiments, the PQ device 101 may also aggregate triggered waveforms.

In some embodiments, the PQ device 101 includes hardware capable of current measurements, such as, for example, Rogowski coil transducers with hardware or software integration.

In various embodiments, the low power wireless communications device 306 may be any suitable device for wireless communication and data transmission, including, for example, RF, Wi-Fi, or Bluetooth devices. The low power wireless communications device 306 may wirelessly communicate with various external sensors 305, using, for example, a low power wireless communications protocol. The low power wireless communications device 306 may be part of, or separate from, the wireless communications device 104.

External sensors 305 may include temperature, solar insolation, humidity, or other environmental sensors, or to sensors attached to other electrical devices (e.g., oil temperature and pressure sensors on a distribution transformer, battery sensors on substation battery banks). These sensors may use energy harvesting techniques for power, and present slow-rate data to the PQ device 101. Alternatively, external sensors 305 may connect to the PQ device 101 through USB or Ethernet. In the case of Ethernet, Power over Ethernet (PoE) techniques may be used, where the PQ device 101 supplies power to the sensors over the Ethernet connection. In embodiments including external sensors 305, the PQ device 101 may read the sensor data, and incorporate the sensor data into its own processing, including data storage, alert trigger processing, and transmission to the cloud-based server system 107.

In some embodiments, the PQ device 101 may optionally include an interface to a SCADA system, for example using the DNP3 or IEC-61850 protocol. With this interface, the PQ device 101 is a slave to the SCADA master, and can be polled at any time, or send unsolicited response by exception messages if a trigger condition is met. The SCADA interface may use the same network connection as the cloud interface, or a separate one (e.g. SCADA using Ethernet, cloud using CDMA cell modem). Separate interfaces allow the SCADA side to reside in a secure network environment, segregated from the cloud-based server system 107.

One embodiment for the PQ device 101 includes suitable voltage and current transducers for connecting to low voltage (600V and below) power distribution networks. The PQ device 101 includes a DSP for computing real-time PQ measurements. A secondary processor (e.g. 32-bit ARM-based controller) collects data from the DSP, manages communications from all ports, handles data storage, and performs all other processing. Available communication ports include Bluetooth (Class and Low Energy), WiFi (ad-hoc and Access Point mode), cell modem (CDMA/GSM/LTE), Ethernet, high speed USB (dual mode, supporting connection to a PC as a peripheral, acting a host when a USB flash drive is attached), and ANT (for connection to external sensors). In this embodiment, the PQ device 101 draws power from the voltage or current signals that it is measuring. Some embodiments use an AC power supply capable of powering the device over the full measurement range (e.g. 60-600 VAC, or 80-250 VAC for residential meter base applications) while other embodiments may involve energy harvesting via capacitive coupling to the voltage monitoring points, or inductive coupling to the current being monitored. A rechargeable battery or super capacitor may allow for ride-thru power during a power outage. Ride-thru power may be used to continue recording through a loss of line power, and/or to provide power for sending a "last-gasp" notification to the cloud-based server system 107 (which may trigger an email or SMS notification), or to a SCADA master.

In some embodiments, such as embodiments for residential service monitoring, a Form 2S meter base collar is located between a revenue meter and meter base. In this embodiment, a specialized enclosure contains the PQ device 101, and allows for voltage and current to pass through the PQ device 101 from the meter base through to the revenue meter. Antennas for Bluetooth, WiFi, GPS, cell, and ANT may be located inside the enclosure to maximize user safety, but may be mounted externally to extend RF range. An external LED and USB port may be included for status monitoring and local connections. In some embodiments, galvanic isolation may be present for the USB connection. In this embodiment, the PQ device 101 includes two voltage and two current channels. The outer Form 2S enclosure may contain an inner plastic enclosure, designed to contain and protect the electronics from the outside environment.

Other physical form factors include small rectangular shapes, using banana jack inputs or fixed leads, and incorporating external Rogowski coil or iron core clamps. These embodiments can be used inside transformer enclosures, electrical panels, or in other small spaces. In this embodiment, the device includes multiple channels for polyphase electrical systems.

One embodiment plugs into a standard 120V receptacle, and includes a 120V pass-through outlet so that a load may be plugged into it. In this embodiment, the outlet optionally may be switchable using a relay or other switch inside the PQ device 101. In this embodiment, the PQ device 101 may include one or two voltage channels (one for line-neutral, or two for measuring line-neutral and neutral-ground voltages) and one current channel.

In various embodiments, the PQ device 101 may connect to the cloud-based server system 107 when it is powered on, and may send status messages and other information, such as buffered data to the cloud-based server system 107. In various embodiments, the buffered data is sent periodically to the cloud-based server system 107, providing near-real-time access to users. The period for transmission may vary depending on the particular embodiment, and in some instances, on a particular setting within an embodiment. In some embodiments, the buffered data is sent approximately every five minutes. In some embodiments, the buffered data is sent approximately every one minute. In still other embodiments, the buffered data is sent approximately every second.

In various embodiments, the PQ device 101 can record triggered waveforms, transients, min/ave/max data aggregations, histograms, and/or daily profiles into internal non-volatile memory, in parallel with the transmission of data into the cloud system to enable later transmission to the cloud-based server system 107 in case of temporary loss of communication. In some embodiments, recording of triggered waveforms, transients, min/ave/max data aggregations, histograms, and/or daily profiles may also enable data download by a PC, tablet, or smartphone, such as computing device 108 in FIG. 1. This data may be analyzed directly on the downloading device (e.g. by PC software), saved to a data file, or uploaded to the cloud system later. Once uploaded, the data is available to cloud users as if it had been sent directly by the device.

In some embodiments, the PQ device 101 may also be operable to stream data to a local device, such as computing device 108. For example, a tablet or other mobile PC running an application could connect to the PQ device 101 using Bluetooth or WiFi. In some embodiments, computing device 108 can connect to the PQ device 101 via the network 106. In various embodiments, TCP/IP may be used once the WiFi links are established. In some situations, Bluetooth Low Energy may be used for an initial link, and communication may transition to WiFi for faster speeds. If the computing device 108 (table, smart phone, PC, etc.) has a cellular data connection, the PQ device's cell or Ethernet connection may be used, with TCP/IP communications between the two through both devices' cell connections. In the case of a PC, a local USB connection may also be used.

In some embodiments, real-time waveforms, harmonics, vector diagrams, etc. may be queried and displayed by the app from the computing device 108, which presents a full protocol for retrieving all PQ parameters. In addition, all recorded data may be downloaded onto the computing device 108 from the PQ device 101, as mentioned earlier.

In addition to sending the full suite of PQ measurements to the cloud-based server system 107, the PQ device 101 also checks for trigger conditions on each of the measurements. Each measured parameter may have multiple high and low trigger thresholds, with optional sliding averaging window, hysteresis, and minimum trigger time required to meet a trigger condition. If met, a message is sent immediately to the cloud system, along with trigger details. Optionally, all other queued data is flushed to the cloud-based server system 107 when a trigger fires, so that all data is immediately available to cloud users. Any triggered alert conditions detected by the PQ device 101 are sent immediately, possibly triggering emails, text messages, or other actions by the cloud-based server system 107.

The cloud-based server system 107 is composed of one or more servers, executing several processes. The cloud-based server system 107 listens for incoming data from external PQ devices, decompresses and stores the data in a file system or database, and post-processes the data for more efficient retrieval. The cloud-based server system 107 also hosts a web-based front end for users to log in, access stored data in the form of graphs and reports, configure PQ devices, and set up email/SMS distribution lists, etc. The cloud-based server system 107 sends formatted email and SMS messages based on trigger conditions received from the PQ devices, as configured by the user through the web front end. The cloud-based server system 107 may also link with PC-based standalone PQ software, importing and/or exporting data to and/or from other software.

The cloud-based server system 107 can be accessed from a standard web browser by the end-user, eliminating the need for installing PC software or involving IT groups. The cloud-based server system 107 can be accessible from a desktop PC, phone, tablet, or any device with internet access and a standards-compliant web browser. Since PQ data goes directly from the PQ device 101 to the cloud-based server system 107, the data is immediately available to all authorized cloud users.

The continuous trickling of PQ data from each PQ device 101 to the cloud-based server system 107 ensures that the most recent data is always available, without physical access to the monitor or a lengthy remote data download.

Figure 3:
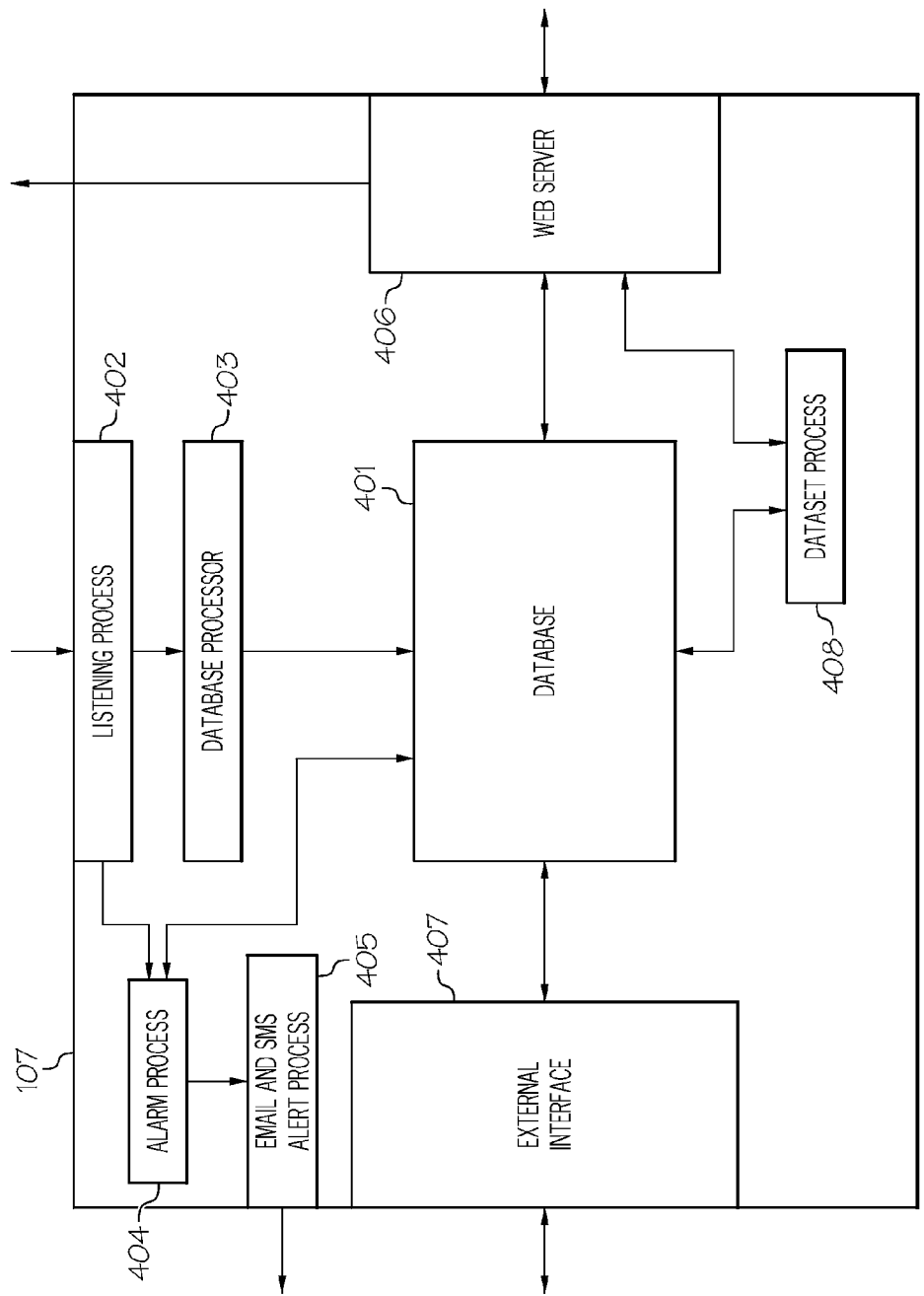
FIG. 3 schematically depicts a cloud-based server system according to one or more embodiments shown and described herein.

Various embodiments for the cloud-based server system 107 include a networked collection of servers, running Linux or BSD Unix. FIG. 3 illustrates an example embodiment of a cloud-based server system 107. As shown in FIG. 3, cloud-based server system 107 includes at least one database 401 and a number of processes, including listening process 402, an alarm process 404, an email and SMS alert process 405, and a dataset process 408. FIG. 3 illustrates separate processes for various tasks, and these may exist on separate servers, or combined onto a single server. Cloud-based server system 107 is further illustrated as including a dataset preprocessor 403, a web server 406, and an external interface 407. The cloud-based server system 107 may be any suitable combination of hardware and software, and, as illustrated in FIG. 1 is connected to the network 106.

The database 401 may be any suitable combination of software and hardware for implementing a database. The database 401 may be implemented on the same hardware as the rest of the cloud-based server system 107 or may be implemented on separate hardware as part of the cloud-based server system 107. The database 401 may store the data sent to the cloud-based server system 107 from the PQ devices 101.

In various embodiments, database 401 is a relational database (e.g. DB2, or MySQL) and may be used to store metadata including, but not limited to, PQ device identification, location, user account information, email and SMS distribution lists, etc. Raw PQ data may be stored in the database, or optionally stored as separate binary files in a suitable file system (e.g., zfs). In the case of external files, the database 401 may store file pointers to the raw data, or metadata that allows the file names and directories to be computed algorithmically as needed. File-based data may be stored on one or several machines or virtual machines. In some embodiments, a file system is used in place of, or in addition to the database 401.

In various embodiments, the data is stored in the database 401 in chunks, which may be, for example, 240 to 1800 data points long. The data may be chunked in the PQ device 101 or by a process on the cloud-based server system 107, such as a process performed by the dataset preprocessor 403. For example, the dataset preprocessor 403 may accumulate incoming data and resize the chunks to the desired chunk level. Chunking the incoming data from the PQ devices 101 may allow for increased database performance by avoiding performing an insert operation on the database 401 for each received data point. The chunks may be stored with a timestamp and chunk length.

In various embodiments, data decimation is used to reduce the bandwidth required for very long duration graphs. The original 1 cycle min/max and 1 second average values for each PQ quantity are available, as measured by the PQ devices, but the user may also change the averaging interval. For example, a 1 minute average may be desired instead of 1 second. The data stored on the server is decimated in a way that facilitates this. For example, with a decimation factor of 10, each data source is stored in raw form, then with the first level of decimation, the min, average, and max values over those 10 points is stored (for a net reduction of 10/3 in data size). The next high decimation level combines 10 of the first set of decimated values to generate min/ave/max value over 100 of the original raw data (a data reduction of 100/3). At the next higher level, min/ave/max values are generated from 10 of the previous level, and so on as needed. This decimation process is performed for each separate data type from the PQ device, including the individual 1 cycle minimum and maximum, and 1 second average trend data sets. The min and max decimated values are used for generating decimated graphs, and the decimated average values are used for computing graphs of different averaging intervals, and daily profiles.

The database 401 may also store the data as decimated stripchart data. For example, if a graph of one year's worth of stripchart data, including one-second averages, is desired, a large number of points may be returned: 86400×365=31 million points. If this is graphed on a normal sized display, such as, for example, a 1024 pixel wide graph, each pixel column in the x-axis may have over 30,000 points, and thus each point may not be visible. Instead of returning all 31 million points, it may suffice to just return two sets of reduced-resolution traces. In this case, a decimation factor of 4096 may be used, resulting in two traces of 7500 points. Each of those "points" may cover 4096 actual stripchart points. One trace may be a time series of the maximum values of each set of 4096 points, and one trace may be the minimum values. These two traces may be sent to the requesting application, and graphed. The graph may be rendered by drawing a line from the 1st point's maximum value, to that point's minimum value, then to the next point's maximum value, at most one pixel over on the x-axis, and so on. This graph would may be visually identical to graphing the original 31 million point dataset, and may still show the absolute maximum and minimum values, no matter how far out the graph is zoomed. If a user zooms in on the graph, a new decimated stripchart may be returned. If the requested points are small enough, a different decimation level may be used, or none at all.

One decimation strategy may be, for example, to use factors of 16. The raw chunked data may be stored normally in the database 401. The data may then be decimated by a factor of 16, and the maximum/minimum values may be stored. For example, for every 16 points in a chunk, a maximum value and minimum value may be stored. These values may also be stored in chunks in the database 401. The decimated data may then be further decimated by a factor of 16, and so on. For example, as many as 8 levels of 16× decimation may be required. When a stripchart request is received, a start time and end time may be received. A process on the cloud-based server system 107, such as, for example, the dataset process 408, may compute the appropriate decimation level such that a suitable number of points are returned. The number of points returned may be large enough so that the graph of maximum/minimum values may be visually identical to the full dataset plot, but no larger, which may minimize the amount of data transferred.

The decimated stripcharts may be computed as the data is received by the cloud-based server system 107, for example, by the dataset preprocessor 403, and then sent to the database 401 in real-time, or an offline batch process may retrieve the raw data from the database 401, decimate it, and store it back in the database 401. Alternatively, the data may be stored in the database 401 without decimation, and decimation may performed as necessary when data is requested from the database 401. This may allow the sending of the smaller sets of data provided by decimation, without having to maintain a decimated database 401. In an alternate embodiment, decimated data may be stored as binary files instead of directly in database 401.

The dataset preprocessor 403 may also listen for bulk data transfers from PC, tablet, or smartphone applications, typically data downloaded from a PQ device via a local connection. Recorded data files from PQ devices 101 may be uploaded into the cloud-based server system 107 from separate PC software, tablet, or smartphone device. These files, previously downloaded via local or remote connection to a PQ device 101, represent individual recording sessions. Once uploaded, these recordings are available for data analysis in the same way that data streamed directly to the cloud-based server system 107 from a PQ device 101 is presented. Incoming downloaded data is converted to the cloud-based server system data format, indexed, optionally decimated, stored for viewing view the web interface. Data from either source is able to be graphed or reported together. A unique recording session ID is attached to each incoming packet from a PQ device, which allows streamed data to be matched with a recorded file from the same PQ device and time period that may be uploaded later.

Usage logs may be kept, which may be used to identify which graphs and reports are most likely to be accessed. Graphs and reports identified as likely to be accessed later may be pre-rendered by an offline batch processor.

The listening process 402 listens for incoming connections from PQ devices 101, receives data packets, parses the contents, and distributes the data to other processes, such as the dataset preprocessor 403 and the alarm process 404. The listening process 402 may be any suitable combination of hardware and software, such as, for example, back-end software running on a general purpose CPU in the server system 107. In some embodiments, the listening process 402 may decompress stripchart and other data.

The dataset preprocessor 403 may be any suitable combination of hardware and software. The dataset preprocessor 403 may receive data from the listening process 402, and may perform point chunking, and decimation, as described above, and may insert the data into the database 401 in any suitable manner. For example, data may be inserted into the database 401 directly after being processed through the dataset preprocessor 403, or raw and decimated stripchart buffers may be kept in memory, and when the desired chunk size reached, written to the database 401. In some embodiments, the raw data may be stored in one or more files. For example, a file system may be employed instead of a database.

The alarm process 404 may be any suitable combination of hardware and software for detecting alarm conditions, and may be separate from the database 401, or may be implemented within the database 401 using database triggers and stored procedures. The alarm process 404 may receive raw data from the listening process 402, and may parse the data looking for alarm and event messages from the PQ devices 101. If the alarm process 404 finds an alarm trigger condition in the data, the database 401 may be queried for what action to take. The alarm process 404 may also cache the alarm status of each remote measurement device 101, the latest status values, and the latest real-time analog readings. These cached values may be used to feed the web server 406, to avoid excessive queries to the database 401.

In various embodiments, when a triggered condition alert, an alarm, or an event message is received by the cloud-based server system 107, and specifically the alarm process 404, the alarm process 404 may identify at least one related event based on data received from another PQ device. In some embodiments, the alarm process 404 may correlate the event message received from one PQ device with data received from a different PQ device. For example, a first PQ device may send an event message which may trigger the alarm process 404 to review data from other PQ devices for the same time period in order to identify a related event. In some embodiments, the alarm process 404 attempts to identify related events based on a user input, such as an instruction to review the data from one or more other PQ devices. In various embodiments, the data corresponding to the event from multiple PQ devices may be displayed on a web page by the web server 406, as described hereinbelow.

In various embodiments, the cloud-based server system 107 transmits at least one email or SMS message to a user responsive to receiving an alert or trigger condition from the PQ device 101. The alarm process 404 may identify the alert or trigger condition and trigger the email and SMS alert process. The email and SMS alert process 405 may be any suitable combination of hardware and software for transmitting alert communications from the server system 107. The email and SMS alert process may query the database 401 to determine the correct distribution list for a specific alarm condition. The email and SMS alert process 405 may send out alerts, for example, using email and SMS messages, when notified of an alarm condition or event message, such as a trigger condition, by the alarm process 404. Email alerts may be formatted, and may include text or graphical data displays, and URLs which load web content. Emails and SMS messages may be configured according to the particular alert and device.

The dataset process 408 may be any suitable combination of hardware and software for retrieving and processing data from the database 401. When a stripchart request is received from, for example, the web server 406, the dataset process 408 may query the database 401 for the necessary chunks needed to build the desired stripchart data. The dataset process 408 may retrieve the chunks, and reconstruct the data for the desired interval using the chunked data. The dataset process 408 may also be used to generate reports and graphs using the retrieved data.

The web server 406 may be any suitable combination of hardware and software for hosting a web page. In some embodiments, the web server 406 may be an Apache server. The web server 406 may host a web front-end, such as, for example, a web page accessible through the Internet, which may act as a user interface for the demand management monitoring system. The web server 406 may be accessible over the network 106 to any suitable computing device 108, such as, for example, a personal computer or smartphone. In various embodiments, the website is configured to provide data to a user without the use of any client-side plug-ins or other code that require software installation. The web server 406 may be able retrieve data as necessary from the database 401, for example, using the dataset process 408, and may be able to communicate with the PQ devices 101, allowing the PQ devices 101 to be controlled through the computing device 108.

The external interface 407 may be any suitable combination of hardware and software for interfacing with the external utility systems 109 (shown in FIG. 1). For example, the external interface 407 may include a DNP3 interface to an electric utility SCADA system. The external interface 407 may act as a DNP3 gateway, and may respond to DNP3 polls and requests by returned the appropriate data from the database 401, duplicating the responses the PQ devices 101 would have sent if the PQ devices 101 implemented the DNP3 protocol. If an alarm or event is received from the PQ devices 101 by the cloud-based server system 107, a corresponding unsolicited message may be sent through the external interface 107 to the external utility system 109, for example, using DNP3 to send a message to a SCADA system. The external interface 107 may emulate the performance of a system where the PQ devices 101 had direct links to the external utility system 109, such as, for example, DNP3 links directly to a SCADA system.

Alternatively, the PQ devices 101 may interface directly with the external utility system 109, for example, using DNP3 or any other suitable protocol, while simultaneously interfacing with the server system 107. The PQ devices 101 may send compressed block data to the server system 107, and also send telemetry data to the external utility system 109, for example, through the SCADA system, as requested by the SCADA master controller. The PQ devices 101 may be able to send alerts and alarm conditions through either interface. The PQ devices 101 may also only interface with the external utility system 109, and there may be no server system 107.

In various embodiments, one or more additional processes may be performed by the cloud-based server system 107. These processes may be included in the processes identified hereinabove, or may be separate processes. For example, a graph/report rendering process can handle incoming graph and report requests from the web server 406 (generated by users on the website). This process gathers stored data from PQ devices, renders the desired graph or report, and sends it to the web server 406 for display in the user's web browser. This graph/report rendering process is also used to create formatted emails with embedded graphs. As another example, a process may be used for real-time communications with PQ devices, where the user initiates a link through the web interface for live data viewing. In some embodiments, a supervisory process monitors other processes, restarting them if necessary, keeping process logs, and sending administrative alert and status emails as needed for proper system operation. Although separate, distinct processes have been described, it is contemplated that such processes may be integrated with one another.

In various embodiments, the cloud-based server system 107 also allows the user to put a PQ device 101 into "burst mode." Burst mode enables the cloud-based server system 107 to send a message to the PQ device 101, which then sends live readings on a second by second basis back to the server, for display in the user's web browser. These readings can be text-based real-time measurements, or entire waveforms, graphed as a time series, harmonic decomposition, or vector diagram in the user's browser.

Various embodiments enable the user to further modify the configuration of the PQ devices 101 through the cloud-based server system 107. Standard or custom configurations may be stored or retrieved from the database by the user. In some embodiments, the cloud-based server system 107 may display an interface for configuration of the PQ device, providing various configuration options to the user. In some embodiments, the device configuration may be queried through the cloud-based server system 107, altered by the user in the web browser, and sent back to the PQ device 101. The user may alter the configuration of one or more PQ devices by providing a user input at the interface indicating one or more configuration settings for the PQ device(s). In some embodiments, device configurations can be saved as a template to be applied to new PQ devices added to the system.

In addition to connecting directly to the PQ device 101, as described hereinabove, in some embodiments, the computing device 108 may connect to the cloud-based server system 107. The cloud-based server system 107 can present data to the user through the smartphone or tablet web browser, with customizations for device-specific interaction (e.g., swipe and other gestures, pinch to zoom, rotating screen, etc.) that may not be present on a traditional PC web browser. A custom smartphone or tablet app may also connect directly to the cloud-based server system 107 through a programming interface, bypassing the browser.

Figure 4:
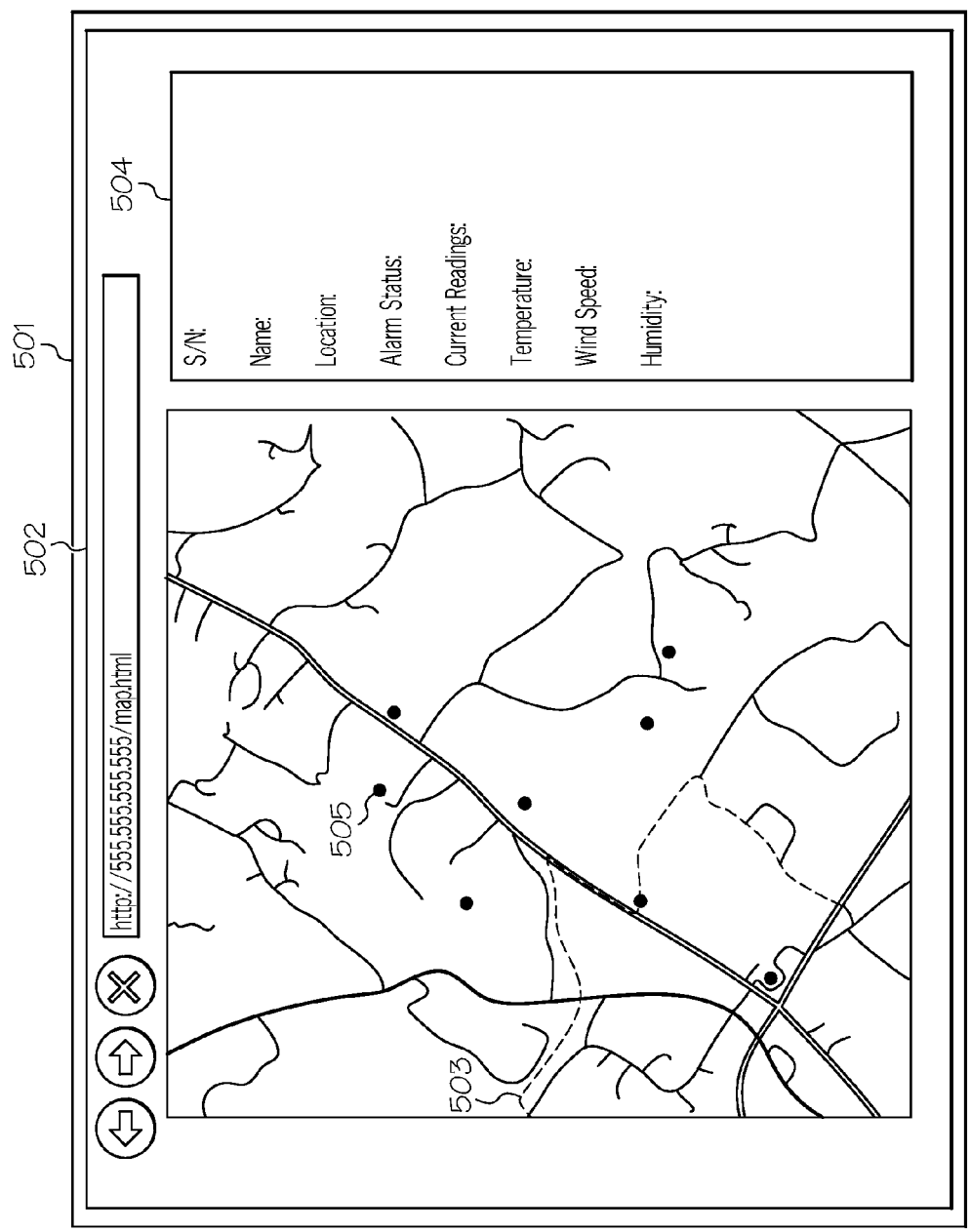
FIG. 4 schematically depicts a web-based front end according to one or more embodiments shown and described herein.

In various embodiments, the web page presents a map-based view of the PQ devices, overlaying device status information with a map of the region, as shown in FIG. 4. FIG. 4 depicts an exemplary web front-end. The web front-end may be a web page 502, displayed in a web browser window 501. The web browser window 501 may be part of any suitable web browsing software. The web page 502 may include a map 503, with markers, such as, for example, the marker 505, locating the PQ devices 101. Information about the PQ devices 101, such as, for example, current alarm status, serial number, name, current readings, and current environmental measurements, may be displayed using graphical icons and indicators on the web page 502, for example, in information sidebar 504. Information may also be displayed in any other suitable manner, for example, in a pop-up window or on a separate screen after selecting the marker 505 for one of the PQ devices 101 on the map 503. The information displayed and the manner in which the information is displayed may be settable by users, with the specific parameters pulled from the database 401. For example, clicking on the marker 505 may pop up a display window showing real time readings. The user may click to start "burst mode", which may cause the web server 406 to send a request to the PQ device 101 to start sending real-time updates. In this mode, the web page 502 may display continuous real-time readings, while burst mode lasts.

The locations of the PQ devices 101 may be entered manually, for example, by dragging the markers 505 on the map 503, acquired from an on-board GPS, or computed from cell tower location information gathered from the PQ devices 101. Other utility assets may also be displayed on the map 503, along with overlays for third party information such as weather (e.g., solar insolation, cloud cover, temperature, humidity, etc.) or electrical distribution system information (e.g., line loading, known faults). Utility asset, weather, electrical distribution system, and other information displayed on the map 503 may be acquired from the PQ devices 101 or from other weather sources, GIS asset data from electric utilities, such as, for example, pole locations, substation locations, and so on. These overlays may be configured by the user.

Each account contains a subset of the PQ devices, so that users can only view their own devices. A user may view graphs and reports of stripchart, daily profiles, histograms, waveforms, vector diagrams, harmonic bar charts 3D harmonic graphs, and the like of recent PQ data from one or more devices, and can easily zoom in or out to view any desired time period.

The web page 502 may be used to request the generation of reports, such as, for example, basic HTML reports. Using the web page 502, the user may request a report, which may cause the web server 406 to invoke a process on the server system 107, such as, for example, the dataset process 408, which may query the database 401 for the values needed for the specific report, render it in HTML, and display the report to the user on the web page 502. User input to the web page 502 can be received by the computing device 108 and transmitted to the cloud-based server system 107. Optionally, the report may be rendered as a PDF, Excel spreadsheet, or any other suitable format. The look and feel of the report may be customized, for example, with a company logo, header, footer, and so on, by the user. Users may also create reports by writing suitable code, with knowledge of the database schema used by the database 401. Reports may also be created with a graphical wizard or a drag and drop scheme.

Graphs of any time series data in the database 401 may be displayed on a display of the mobile device 108 as the web page 502. For example, graphs may include a stripchart, a daily profile, a histogram, a waveform, a vector diagram, a harmonic bar chart, and a 3D harmonic graph generated using the stored data, among other graphs and reports. In various embodiments, graphs and reports may show one or more of the RMS voltage, the RMS current, the power factor, the displacement power factor, the phase angle, the harmonic magnitudes and phases, the interharmonics, the IFL, the Pst, and Plt flicker, the symmetrical components, the phasors, the aggregated triggered waveforms, and the transients received from one or more PQ devices. In some embodiments, graphs or charts may show the average of the RMS voltage, the RMS current, the power factor, the displacement power factor, the phase angle, the harmonic magnitudes and phases, the interharmonics, the IFL, the Pst, and Plt flicker, the symmetrical components, the phasors, the aggregated triggered waveforms, and the transients received from one or more PQ devices over a user-defined interval. User-defined intervals may be received through the web page 503 and used to calculate the averages, as described hereinabove.

A process on the server system 107, such as, for example, the dataset process 408, may be invoked by, for example, an AJAX call, and may access the stripchart data, including dechunking and appropriate decimation, from the database 401 and return the data as a JSON object to the web browser 501. Javascript code in the web browser 501 may then render the graph on a canvas object for display on the web page 502. Flash, JAVA, or PC client code implementations may also be used.

Graphs may be customized, including customized trace colors and properties, annotations, markers, and so on. Stripchart information from one of the remote measurement devices 101 can be added or removed from the graph dynamically, for example, by dragging the marker 505 for the remote measurement device 101 from the map to the graph, or by dragging a trace for the remote measurement device 101 back off the graph. A custom view or annotated graph may be saved in the database 401 for later recall, or saved as a URL which may be bookmarked, or sent to other users. In various embodiments, the web graphing system allows the user to mix data from multiple devices on to a single graph, and also mix different measurement types (e.g., RMS voltage and THD) on a single graph. Multiple plots, left and right y-axes, and stacked axis techniques are used to meaningfully display large data sets. Clickable links on the graphs allow the user to pull up triggered event data on trend graphs (e.g. an RMS voltage stripchart may have a link that, when clicked, generates a waveform capture graph triggered at that time).

Although individual magnitude and phase information from each harmonic may be sent by the PQ devices 101, the cloud-based server system 107 may also perform a spectral analysis from waveform capture directly, available to the user as a harmonic bar chart on the web page. An interactive harmonic graph allows the user to select the time period in a waveform is analyzed. A similar method may be used to present interactive vector diagrams. In addition, waveform data may be used to compute a sample-by-sample sliding RMS capture graph. If such data is present, the trend/stripchart graphs may be zoomed into a level that automatically switches to a sample-based RMS view, or raw waveform.

In various embodiments, a web interface allows users to add or remove uploaded data files, as discussed above, or share them with others. A graph or report may be converted to a link which allows a second user to generate the same graph (e.g. a link may be emailed to another user, which launches the website and generates the graph when clicked). If the second user does not have an existing account, a new, temporary one may optionally be created, or the link may require an existing account, or membership in a certain group. Other users associated with the same account may download files back to a PC that have been uploaded by prior users, and data that has been sent directly to the cloud-based server system from a PQ device in a specified time period may be exported into a file format suitable for loading into standalone software (e.g., ProVision, Excel, etc.) In some embodiments, all data packets with a common recording session ID may be combined to generate a recording file equivalent to one generated from a local PQ device download.

Several methods may be used to charge a fee for the cloud service. In one embodiment, a fixed time period (e.g., last rolling two weeks) is offered for free, or a reduced charge, and a separate fee is charged for permanent storage. In another method, a yearly fee may be associated with data storage. Alternatively, live data access and email alerts are offered for no fee, but long-term data storage may be subject to a fee. A separate fee may be used for PQ device storage than for file uploads from other software.

Figure 5:
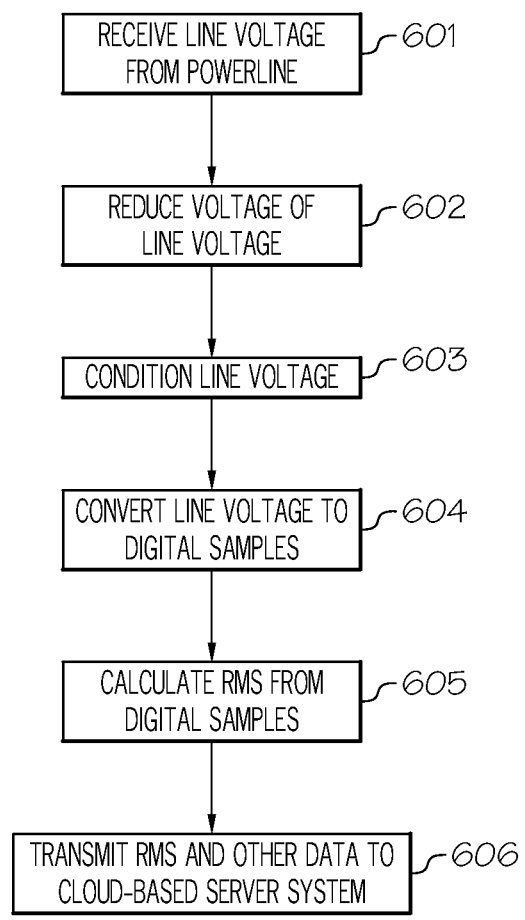
FIG. 5 is a block diagram of an example process for operating a power quality device according to one or more embodiments shown and described herein.

FIG. 5 depicts an exemplary procedure for operating a remote measurement device. In block 601, a line voltage may be received from a powerline. For example, the powerline 103 may be connected to the voltage input 102 of the PQ device 101.

In block 602, the voltage of the line voltage may be reduced. For example, the PQ device 101 may have a voltage reducer 301, such as a transformer or a pulse-withstanding divider resistor, connected to the voltage input 102. The line voltage may pass through the voltage reducer 301 and end up with a reduced voltage.

In block 603, the line voltage may be subject to signal conditioning. After being reduced in voltage, the line voltage may be conditioned in any suitable manner by the signal conditioning circuit 302. For example, the line voltage may be run through a low-pass filter.

In block 604, the line voltage may be converted into digital samples. For example, the PQ device 101 may have the A/D converter 303 connected to the signal conditioning circuit 302. After the voltage of the line voltage has been reduced and conditioned, the line voltage may be digitized by the A/D converter 303 and output as a digital signal with digital samples.

In block 605, the RMS voltage of the line voltage may be calculated based on the digital samples of the line voltage. For example, after the A/D convertor 303 converts the line voltage to digital sample, the digital samples may be fed into the microprocessor 304. The microprocessor 304 may use any suitable algorithm for calculating RMS voltage based on the digital samples. The microprocessor 304 may also receive other data, for example, from the external sensors 305, which may be used in the calculation of RMS voltage, or may be packaged along with the RMS voltage data for transmission to the cloud-based server system 107. Alert or event messages may also be generated by the microprocessor 304, as appropriate, and sent along with the RMS voltage and other data.

In block 606, the RMS voltage and other data may be transmitted to a server system. For example, the microprocessor 304 may send the RMS voltage and other data to the wireless communications device 104. The wireless communications device 104 may communicate with the network 106 with wireless signal 105. The RMS voltage and other data may be routed through the network 106 to the cloud-based server system 107, where the data may be received by, for example, the listening process 402. The RMS voltage and other data may be compressed, and may be sent using a low data rate telemetry plan. For example, the RMS voltage and other data may be compressed a compression rate of up to 30:1 using differential and arithmetic compression techniques. The compression algorithm and chunk size of the data may be adjustable, in order to allow for fine-tuning of the system to keep the data transfer as small as possible.

Although the exemplary procedure of FIG. 5 specifically describes computing RMS voltage, it should be understood that other PQ measurements, such as RMS current, flicker, harmonics, waveform capture, etc., can be computed and transmitted in a similar manner.

Figure 6:
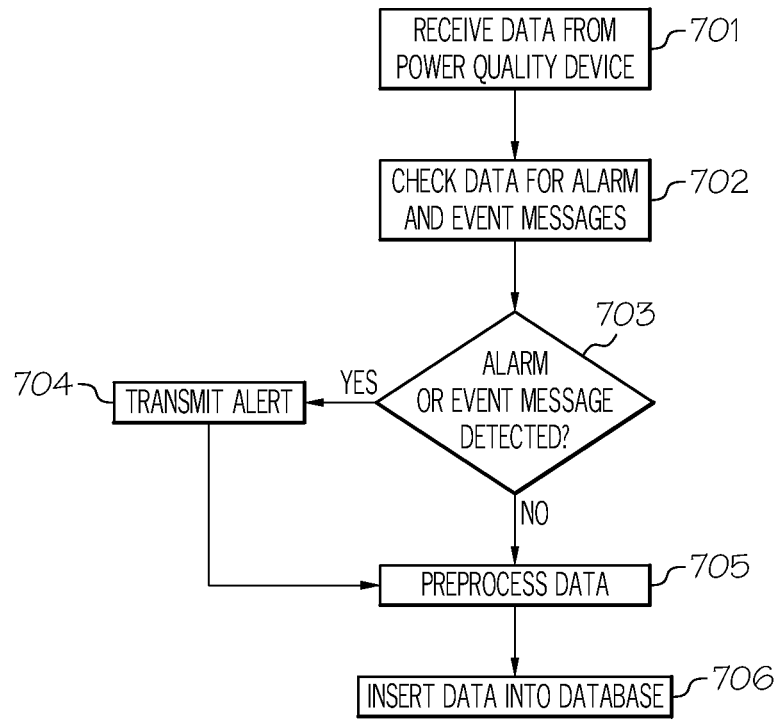
FIG. 6 is a block diagram of an example process for receiving data from a power quality device at the cloud-based server system according to one or more embodiments shown and described herein.

FIG. 6 depicts an exemplary procedure for receiving data from a PQ device at a cloud-based server system. In block 701, data from a PQ device may be received. For example, data, including RMS voltage and other data, sent from the PQ device 101 may be routed through the network 106 to the cloud-based server system 107. The listening process 402 may receive the data.

In block 702, the data may be checked for alarm and event messages. For example, the listening process 402 may send the data to the alarm process 404, and the alarm process 404 may determine if the data includes any alarm or event messages.

In block 703, if an alert or event message is detected in the data, flow proceeds to block 704, otherwise flow proceeds to block 705.

In block 704, an alert may be sent out. For example, if the alarm process 404 determines that the data includes an alert or event message, the alarm process 404 may trigger the email and SMS alert process 405, which may transmit an alert. The alert may be transmitted by email, SMS, or using any other suitable manner of communication. The email and SMS alert process 405 may check the database 401 to determine what kind of message to transmit based on the alert or event message that was found in the data.

In block 705, the data may be preprocessed. For example, the listening process 402 may send the data to the dataset preprocessor 403, where the data may be decimated and chunked, as described above. Any other preprocessing may also be preformed, such as, for example, correlating the RMS voltage data with the other data, including, for example, data from the external sensors 305.

In block 706, the data may be inserted a database. For example, after the data has been preprocessed by the dataset preprocessor 403, the processed data may be inserted in the database 401 for long term storage and retrieval.

Figure 7:
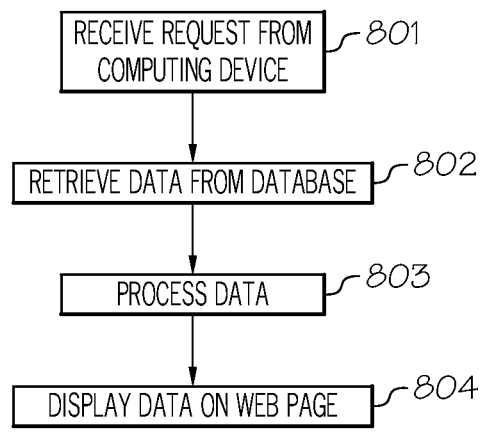
FIG. 7 is a block diagram of an example process for operating a web server on the cloud-based server system according to one or more embodiments shown and described herein.

FIG. 7 depicts an exemplary procedure for operating a web server on the cloud-based server system. In block 801, a web server on a cloud-based server system may receive a request from a computing device. For example, a user using the computing device 108 may use the web browser 501 to navigate to the web page 502, which may display the map 503 and data on the PQ devices 101. The request from the computing device 108 for the web page 502 and the data displayed on the web page 502 may be transmitted through the network 106 to the cloud-based server system 107, where the web server 406 may receive the request.

In block 802, data may be retrieved from a database in response to the request for data. For example, the web server 406 may invoke the dataset process 408, which may retrieve the requested data from the database 401.

In block 803, the data may be processed. For example, the dataset process 408 may process the data, for example, by decimating data that has not already been decimated, and converting the data into a report or graph suitable for display on the web page 502. The web server 407 may also process the data, for example, correlating the data with the marker 505 for the appropriate PQ device 101 on the map 503.

In block 804, the data may be displayed on the web page. For example, the data may be displayed on the web page 502 in the web browser 503, so that the user may view and interact with the data on the computing device 108. Displaying the data may include displaying the map 502, displaying the information sidebar 504, displaying the data in pop-up windows, or in graph or report form.

Since the cloud-based server system has data from multiple PQ devices, various embodiments enable data analysis techniques that are difficult or impossible otherwise. For example, aggregated data from multiple PQ devices can be used to compute Total Demand Distortion over a distribution system. As another example, the system model can be verified by having access to unified data from an entire circuit. Correlations from PQ devices at different locations can be used to spot trends or problems. In distributed generation systems, the map-based display can be used to show the amount of locally generated power at each location in near-real-time, and this can be overlaid with solar insolation or cloud cover to identify impending changes or trends.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wire line varieties thereof, and/or any other computerized device capable of configuration for receiving, storing and/or processing data for standalone application and/or over a networked medium or media. Examples of communication media that can be employed include, without limitation, wireless data networks, wire line networks, and/or a variety of networked media.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, DVD, compact disc, memory stick, ROM (read only memory), RAM (random access memory), PROM (programmable ROM), EEPROM (extended erasable PROM), and/or other like computer-readable media.

In general, computer-readable media may include any medium capable of being a carrier for an electronic signal representative of data stored, communicated or processed in accordance with embodiments of the present invention. Where applicable, method steps described herein may be embodied or executed as instructions stored on a computer-readable medium or media.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system comprising:
a plurality of power quality devices configured to continuously measure and buffer power quality data including at least one of RMS voltage, RMS current, real, reactive and apparent power, power factor, displacement power factor, phase angle, harmonic magnitudes and phases, interharmonics, IFL, $P_{ST}$, and Plt flicker, symmetrical components, phasors, aggregating triggered waveforms, and transients;
the plurality of power quality devices are further configured to compress and transmit the buffered power quality data; and
one or more cloud-based servers communicatively coupled to the plurality of power quality devices, the one or more cloud-based servers configured to:
receive the buffered power quality data transmitted by the plurality of power quality devices;
decompress and store the buffered power quality data in a database or a file system; and
display on a web page one or more of a stripchart, daily profile, histogram, waveform, vector diagram, harmonic bar chart, and 3D harmonic graph generated using the stored data,
wherein the one or more cloud-based servers are further configured to transmit at least one email or SMS message to a user responsive to receiving a trigger condition from one or more of the plurality of power quality devices.

2. The system of claim 1,
wherein the one or more cloud-based servers are further configured to decimate the stored power quality data; and
wherein the power quality data includes at least one of the harmonic magnitudes, total harmonic distortion, the $P_{ST}$ and the Plt flicker, and triggered waveforms.

3. The system of claim 1, wherein the one or more cloud-based servers are further configured to transmit at least one email or SMS message to a user responsive to receiving an alert from one or more of the plurality of power quality devices.

4. The system of claim 1, wherein the one or more cloud-based servers are further configured to transmit an email to a user that provides one or more of the stripchart, daily profile, histogram, waveform, vector diagram, harmonic bar chart, and 3D harmonic graph generated using the stored data.

5. The system of claim 1, wherein the one or more cloud-based servers are further configured to display on the web page an interface for configuration of the power quality device.

6. The system of claim 5, wherein the one or more cloud-based servers are further configured to transmit an altered device configuration to one or more of the plurality of power quality devices responsive to receiving a user input at the interface for configuration of one or more of the plurality of power quality devices.

7. The system of claim 1, wherein one or more of the plurality of power quality devices are configured to transmit the buffered power quality data approximately every five minutes.

8. The system of claim 1, wherein one or more of the plurality of power quality devices are configured to transmit the buffered power quality data approximately every minute.

9. The system of claim 1, wherein one or more of the plurality of power quality devices are configured to transmit the buffered power quality data approximately every second.

10. A computer-implemented method, the method comprising:
receiving with one or more cloud-based servers, from a first power quality device, power quality data comprising at least one of an RMS voltage, an RMS current, a power factor, a displacement power factor, a phase angle, harmonic magnitudes and phases, interharmonics, IFL, $P_{ST}$, and Plt flicker, symmetrical components, phasors, aggregated triggered waveforms, and transients approximately every five minutes;
displaying a map on a web page generated by the one or more cloud-based servers, wherein the map comprises a marker indicating a location of the first power quality device and a second power quality device;
displaying on the web page generated by the one or more cloud-based servers at least one chart or graph showing one or more of the RMS voltage, the RMS current, the power factor, the displacement power factor, the phase angle, the harmonic magnitudes and phases, the interharmonics, the IFL, the $P_{ST}$, and Plt flicker, the symmetrical components, the phasors, the aggregated triggered waveforms, and the transients;
receiving with the one or more cloud-based servers, from the first power quality device, a triggered condition alert;
identifying with the one or more cloud-based servers at least one related event based on data received from the second power quality device; and
sending an email or an SMS message to a user responsive to receiving the triggered condition alert from the first power quality device with the one or more cloud-based servers.

11. The computer-implemented method of claim 10, the method further comprising:
decimating the power quality data to generate decimated power quality data;
displaying on the web page the decimated power quality data in at least one chart or graph showing one or more of the harmonic magnitudes, total harmonic distortion, the $P_{ST}$ and the Plt flicker, and triggered waveforms received from the first power quality device; and
displaying on the web page at least some data received from the second power quality device.

12. The computer-implemented method of claim 11, further comprising displaying on the web page at least one chart or graph showing one or more of the harmonic magnitudes, total harmonic distortion, the $P_{ST}$ and the Plt flicker, and triggered waveforms received from the first power quality device,
wherein the at least one chart or graph comprises a strip chart, a daily profile, a histogram, a wave form, a vector diagram, a harmonic bar chart, or a 3D harmonic graph.

13. The computer-implemented method of claim 10, the method further comprising decimating the at least one of the RMS voltage, the RMS current, the power factor, the displacement power factor, the phase angle, the harmonic magnitudes and phases, the interharmonics, the IFL, the $P_{ST}$, and Plt flicker, the symmetrical components, the phasors, the aggregated triggered waveforms, and the transients received from the first power quality device based on a decimation factor.

14. The computer-implemented method of claim 10, the method further comprising averaging the at least one of the RMS voltage, the RMS current, the power factor, the displacement power factor, the phase angle, the harmonic magnitudes and phases, the interharmonics, the IFL, the $P_{ST}$, and Plt flicker, the symmetrical components, the phasors, the aggregated triggered waveforms, and the transients received from the first power quality device over an interval.

15. The computer-implemented method of claim 14, wherein the interval is received from a user.

16. The computer-implemented method of claim 14, wherein the at least one chart or graph shows the average of the at least one of the RMS voltage, the RMS current, the power factor, the displacement power factor, the phase angle, the harmonic magnitudes and phases, the interharmonics, the IFL, the $P_{ST}$, and Plt flicker, the symmetrical components, the phasors, the aggregated triggered waveforms, and the transients received from the first power quality device over the interval.

17. A system comprising:
a plurality of power quality devices configured to continuously measure and buffer power quality data;
the plurality of power quality devices configured to compress and transmit the buffered power quality data on a periodic basis;
one or more cloud-based servers communicatively coupled to the plurality of power quality devices, the one or more cloud-based servers configured to:
receive the buffered data transmitted by the power quality devices;
decompress and store the buffered data in a database;
display on a web page one or more of a stripchart, daily profile, histogram, waveform, vector diagram, harmonic bar chart, and 3D harmonic graph generated using the stored data; and
one or more computing devices communicatively coupled to the plurality of power quality devices and the one or more cloud-based servers, the one or more computing devices configured to receive at least one user input to the web page,
wherein the one or more cloud-based servers are further configured decimate the buffered data to generate decimated power quality data; and
wherein the one or more cloud-based servers are configured to display the one or more of the stripchart, daily profile, histogram, waveform, vector diagram, harmonic bar chart, and 3D harmonic graph responsive to receiving a request for the one or more stripchart, daily profile, histogram, waveform, vector diagram, harmonic bar chart, and 3D harmonic graph based on the at least one user input to the web page.

* * * * *